US010769469B2

(12) United States Patent
Huang

(10) Patent No.: US 10,769,469 B2
(45) Date of Patent: Sep. 8, 2020

(54) ERROR PROMPTING METHOD, DEVICE, AND ELECTRONIC APPARATUS

(71) Applicant: BEIJING XIAOMI MOBILE SOFTWARE CO., LTD., Beijing (CN)

(72) Inventor: Xuebin Huang, Beijing (CN)

(73) Assignee: BEIJING XIAOMI MOBILE SOFTWARE CO., LTD., Beijing (CN)

(*) Notice: Subject to any disclaimer, the term of this patent is extended or adjusted under 35 U.S.C. 154(b) by 0 days.

(21) Appl. No.: 16/233,013

(22) Filed: Dec. 26, 2018

(65) Prior Publication Data

US 2019/0205682 A1 Jul. 4, 2019

(30) Foreign Application Priority Data

Dec. 28, 2017 (CN) .......................... 2017 1 1454181

(51) Int. Cl.
| | | |
|---|---|---|
| *G06K 9/20* | (2006.01) | |
| *G01R 27/26* | (2006.01) | |
| *G06K 9/00* | (2006.01) | |
| *G06K 9/03* | (2006.01) | |

(52) U.S. Cl.
CPC .......... *G06K 9/209* (2013.01); *G01R 27/2605* (2013.01); *G06K 9/0002* (2013.01); *G06K 9/03* (2013.01)

(58) Field of Classification Search
CPC ................. G06K 9/00–0012; G06K 9/03–036
See application file for complete search history.

(56) References Cited

U.S. PATENT DOCUMENTS

| 7,584,068 | B2* | 9/2009 | Xu ...................... G01R 31/2829 |
| | | | 702/104 |
| 10,089,546 | B2* | 10/2018 | Bellier ................... G06K 9/036 |
| 10,216,976 | B2* | 2/2019 | Sun ......................... G01R 31/44 |
| 10,482,308 | B2* | 11/2019 | Kim .................... G06K 9/00026 |
| 2003/0042911 | A1* | 3/2003 | Lane ................ G01N 21/95607 |
| | | | 324/537 |
| 2005/0131578 | A1* | 6/2005 | Weaver ............... G01G 19/4144 |
| | | | 700/244 |
| 2007/0206113 | A1* | 9/2007 | Nakamura ......... G06K 9/00013 |
| | | | 348/362 |
| 2008/0208495 | A1* | 8/2008 | Xu ...................... G01R 31/2829 |
| | | | 702/65 |
| 2008/0224721 | A1* | 9/2008 | Kim .................. H01L 27/14618 |
| | | | 324/756.02 |
| 2013/0329031 | A1* | 12/2013 | Miura ................... G06K 9/2018 |
| | | | 348/77 |

(Continued)

OTHER PUBLICATIONS

European Patent Office, Extended European Search Report Issued in Application No. 18248165.5, dated Apr. 18, 2019, Germany, 8 pages.

*Primary Examiner* — Patrick F Marinelli
(74) *Attorney, Agent, or Firm* — Syncoda LLC; Feng Ma

(57) ABSTRACT

A method of prompting a failure or error, applicable to a terminal apparatus including a fingerprint recognizer having a sensor array, includes: obtaining electrical signals containing fingerprint information through the sensor array upon a fingerprint recognition being triggered; determining a number of sensors with abnormally-changing electrical signals in the sensor array; and outputting prompt information upon the determined number of sensors exceeds a number threshold.

12 Claims, 7 Drawing Sheets

(56) References Cited

U.S. PATENT DOCUMENTS

| | | | |
|---|---|---|---|
| 2014/0241598 A1* | 8/2014 | Fedele | G06K 9/00046 382/125 |
| 2015/0071510 A1* | 3/2015 | Kim | G06K 9/00013 382/124 |
| 2015/0106048 A1* | 4/2015 | Xie | G04F 10/105 702/136 |
| 2016/0358003 A1 | 12/2016 | Shen et al. | |
| 2017/0185820 A1* | 6/2017 | Sun | G01R 31/44 |
| 2017/0255328 A1* | 9/2017 | Zyskind | G06F 3/03545 |
| 2017/0344796 A1 | 11/2017 | Zhang et al. | |
| 2017/0344799 A1* | 11/2017 | Zhou | G06K 9/00013 |
| 2017/0344800 A1* | 11/2017 | Zhou | G06F 21/32 |
| 2017/0344803 A1* | 11/2017 | Zhou | G06K 9/00013 |
| 2017/0344841 A1* | 11/2017 | Bellier | G06K 9/0002 |
| 2018/0046848 A1* | 2/2018 | Zhou | G06K 9/62 |
| 2018/0068167 A1* | 3/2018 | Zhang | G06K 9/00026 |
| 2018/0107853 A1* | 4/2018 | Zhou | G06K 9/00013 |
| 2018/0107860 A1* | 4/2018 | Zhou | G06K 9/00026 |
| 2018/0107861 A1* | 4/2018 | Zhou | G06K 9/00013 |
| 2018/0121702 A1* | 5/2018 | Kim | G06K 9/036 |
| 2018/0211084 A1* | 7/2018 | Zhang | G06K 9/00 |
| 2018/0268186 A1* | 9/2018 | Zhou | G06K 9/00013 |
| 2018/0330145 A1* | 11/2018 | Dai | G06K 9/036 |
| 2019/0018123 A1* | 1/2019 | Narasimha-Iyer | G01S 15/8925 |
| 2019/0087623 A1* | 3/2019 | Zhang | G06K 9/00 |
| 2019/0205682 A1* | 7/2019 | Huang | G01R 27/2605 |
| 2019/0205683 A1* | 7/2019 | Huang | G01R 31/3163 |

\* cited by examiner

ERROR PROMPTING METHOD, DEVICE, AND ELECTRONIC APPARATUS

CROSS-REFERENCE TO RELATED APPLICATIONS

This application claims priority to Chinese Patent Application No. 201711454181.5 filed on Dec. 28, 2017, the entire content of which is incorporated herein by reference.

BACKGROUND

Modern terminal apparatuses, such as smart phones and computers, often include fingerprint recognition functions for security purposes. A fingerprint recognizer included in such a terminal apparatus may adopt a hole-less structure having a cover glass (CG), for example. Occasionally, failures or errors may be encountered in a fingerprint recognition process.

SUMMARY

The present disclosure relates to the field of fingerprint recognition technologies, and more specifically to prompting a failure or error.

In a first aspect, a method of prompting a failure or error is provided, and the method may be applicable to a terminal apparatus including a fingerprint recognizer. The method includes: obtaining electrical signals containing fingerprint information through the sensor array upon a fingerprint recognition being triggered; determining a number of sensors with abnormally-changing electrical signals in the sensor array; and outputting prompt information upon the determined number of sensors exceeds a number threshold.

In another aspect, a device for prompting a failure is provided, including: a processor; and memory configured to store processor executable instructions. The processor is configured to obtain electrical signals including fingerprint information through a sensor array in a fingerprint recognizer when it is determined that fingerprint recognition is triggered; determine a number of sensors with abnormally-changing electrical signals in the sensor array; and output prompt information for prompting that the fingerprint recognizer fails when the number of sensors with abnormally-changing electrical signals in the sensor array exceeds a number threshold.

In another aspect, a non-transitory computer-readable storage medium storing instructions is provided. When being processed by a processing circuit, the instructions causes the processor to: obtain electrical signals including fingerprint information through a sensor array in a fingerprint recognizer when it is determined that fingerprint recognition is triggered; determine a number of sensors with abnormally-changing electrical signals in the sensor array; and output prompt information for prompting that the fingerprint recognizer fails when the number of sensors with abnormally-changing electrical signals in the sensor array exceeds a number threshold.

It is to be understood that, both the foregoing general description and the following detailed description describe only some embodiments by way of example, and are not restrictive of the present disclosure.

BRIEF DESCRIPTION OF THE DRAWINGS

In order to clearly illustrate the various embodiments provided in the present disclosure, the following are drawings that accompany the description of the embodiments.

It is noted that these drawings should be interpreted to serve illustrating purposes only, and that these drawings may represent just some, but not all, of embodiments of the present disclosure. For those skilled in the art, other embodiments that are based on the structures as described below and illustrated in these drawings may become obvious. As such, these other embodiments should be interpreted to be contained within the scope of the disclosure.

DETAILED DESCRIPTION

Descriptions will now be made in detail with respect to some embodiments, examples of which are illustrated in the accompanying drawings. The following description refers to the accompanying drawings in which the same numbers in different drawings may represent the same or similar elements unless otherwise represented. The implementations set forth in the following description of example embodiments do not represent all implementations consistent with the disclosure. Instead, they are merely examples of devices and methods consistent with aspects related to the disclosure as recited in the appended claims.

Figure 1:
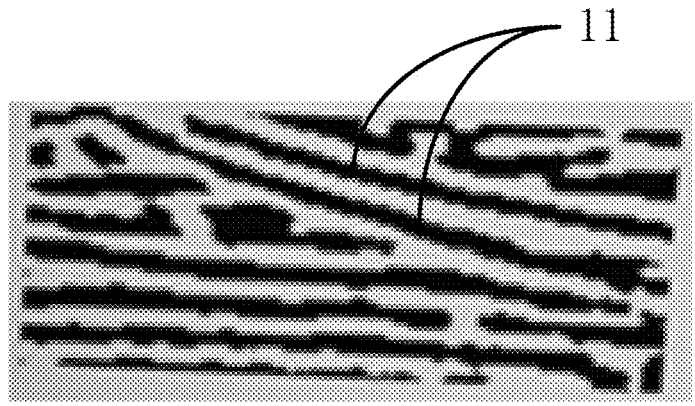
FIG. 1 is a schematic diagram illustrating a fingerprint image collected by a hole-less fingerprint recognizer with a broken CG In some embodiments.

FIG. 1 is a schematic diagram illustrating a fingerprint image collected by a hole-less fingerprint recognizer with a broken CG In some embodiments. If the CG is broken, for example, referring to FIG. 1, two strong characteristic oblique lines 11 may appear in a collected fingerprint image, thereby affecting accuracy of subsequent fingerprint recognition.

Figure 2:
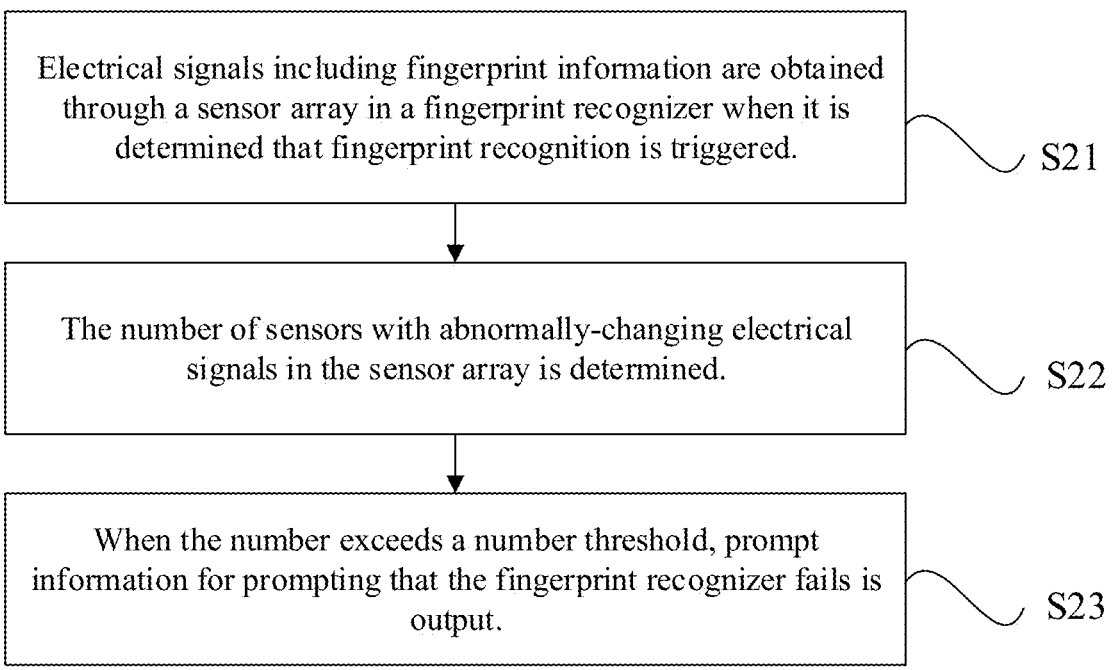
FIG. 2 is a flowchart illustrating a method of prompting a failure according to some embodiments of the present disclosure.

FIG. 2 is a flowchart illustrating a method of prompting a failure or error according to some embodiments of the present disclosure. This example may be applicable to different terminal apparatuses (such as a mobile phone, a tablet computer and a personal computer) including a fingerprint recognizer. As shown in FIG. 2, the method may include the following blocks S21 through S23.

Block S21: electrical signals including fingerprint information are obtained through a sensor array in a fingerprint recognizer when it is determined that fingerprint recognition is triggered.

In some embodiments, in a process of performing fingerprint recognition using a fingerprint recognizer in a terminal apparatus, when a user's finger touches the sensor array of the fingerprint recognizer, the sensor array may detect electrical signals (an electrical signal may be a current signal, a capacitance signal or a voltage signal, which is not limited herein) including fingerprint information, and it is determined that the fingerprint recognition is triggered, thereby obtaining electrical signals including fingerprint information through the sensor array in the fingerprint recognizer.

Block S22: a number of sensors with abnormally-changing electrical signals in the sensor array is determined.

In some embodiments, after the electrical signals including fingerprint information are obtained, the number of sensors with abnormally-changing electrical signals may be determined, where the sensors belong to the sensor array of the above fingerprint recognizer.

In some embodiments, when the user's finger touches the sensor array, values of electrical signals (such as capacitance, voltage or current) detected by the sensor array may change, but a value of an electrical signal detected by a sensor at a position where the fingerprint recognizer fails (for example, CG is broken) may change abnormally. Thus, the number of sensors with abnormally-changing electrical signals may be detected after the electrical signals including fingerprint information are obtained.

Block S23: when the number exceeds a number threshold, prompt information for prompting that the fingerprint recognizer fails is output.

In some embodiments, after the number of sensors with abnormally-changing electrical signals is determined, the number may be compared with a preset number threshold. If the number exceeds the number threshold, it is determined that the fingerprint recognizer fails.

In some embodiments, when it is determined that the fingerprint recognizer fails, prompt information may be output to prompt that the fingerprint recognizer fails.

In some embodiments, a manner of outputting the prompt information may refer to an example shown in FIG. 7 described below, which will not be described in detail herein.

It can be known from the above description that In some embodiments, the number of sensors with abnormally-changing electrical signals in the sensor array of the fingerprint recognizer in the terminal apparatus may be determined when the electrical signals including fingerprint information are detected on the terminal apparatus, and the prompt information for prompting that the fingerprint recognizer fails is output, for example, the prompt information may be generated by invoking a screen locking program, when the number exceeds the number threshold. Thus, a user may be timely informed that the fingerprint recognizer fails, thereby eliminating a potential security hazard that the terminal apparatus is erroneously unlocked.

Figure 3:
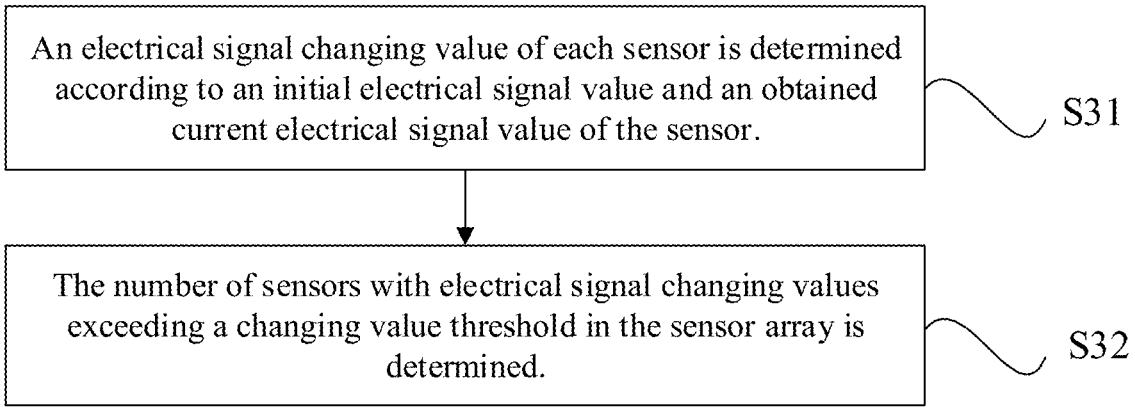
FIG. 3 is a flowchart illustrating determining the number of sensors with abnormally-changing electrical signals according to some embodiments of the present disclosure.

FIG. 3 is a flowchart illustrating determining the number of sensors with abnormally-changing electrical signals according to some embodiments of the present disclosure. The abnormal change of the electrical signal in the above examples may include that an electrical signal changing value exceeds a changing value threshold. As shown in FIG. 3, determining the number of sensors with abnormally-changing electrical signals in the sensor array at block S22 may include the following blocks S31 and S32.

Block S31: for each of the sensors in the sensor array, an electrical signal changing value of the sensor is determined according to an initial electrical signal value and an obtained current electrical signal value of the sensor.

In some embodiments, when a user's finger touches the sensor array, a current electrical signal value of each sensor in the sensor array may be detected.

A capacitive fingerprint recognizer is taken as an example. When the user's finger touches a sensor array of the capacitive fingerprint recognizer, a current capacitive value of each capacitive sensor in the sensor array may be detected as the current electrical signal value.

In some embodiments, after the current electrical signal value is determined, a difference between the initial electrical signal value (for example, an electrical signal value of the sensor when a screen is switched off or the terminal apparatus is just started) of the sensor and the above current electrical signal value is taken as the electrical signal changing value of the sensor.

In some embodiments, a manner of obtaining the initial electrical signal value of the sensor may refer to an example shown in FIG. 4 described below, which will not be described in detail herein.

It is to be noted that the above electrical signal changing value may be calculated by subtracting the current electrical signal value from the initial electrical signal value or subtracting the initial electrical signal value from the current electrical signal value. The calculation manner may be specifically determined according to an actual requirement, which is not limited herein.

Block S32: the number of sensors with electrical signal changing values exceeding the changing value threshold in the sensor array is determined.

In some embodiments, after the electrical signal changing value of each sensor in the sensor array is determined, the determined electrical signal changing value may be compared with the changing value threshold, and the number of sensors with electrical signal changing values exceeding the changing value threshold is counted.

It can be known from the above description that the number of sensors with the electrical signal changing values exceeding the changing value threshold may be determined by detecting the current electrical signal value of each sensor in the sensor array and determining a difference between the initial electrical signal value and the current electrical signal value of each sensor as the electrical signal changing value of each sensor.

Figure 4:
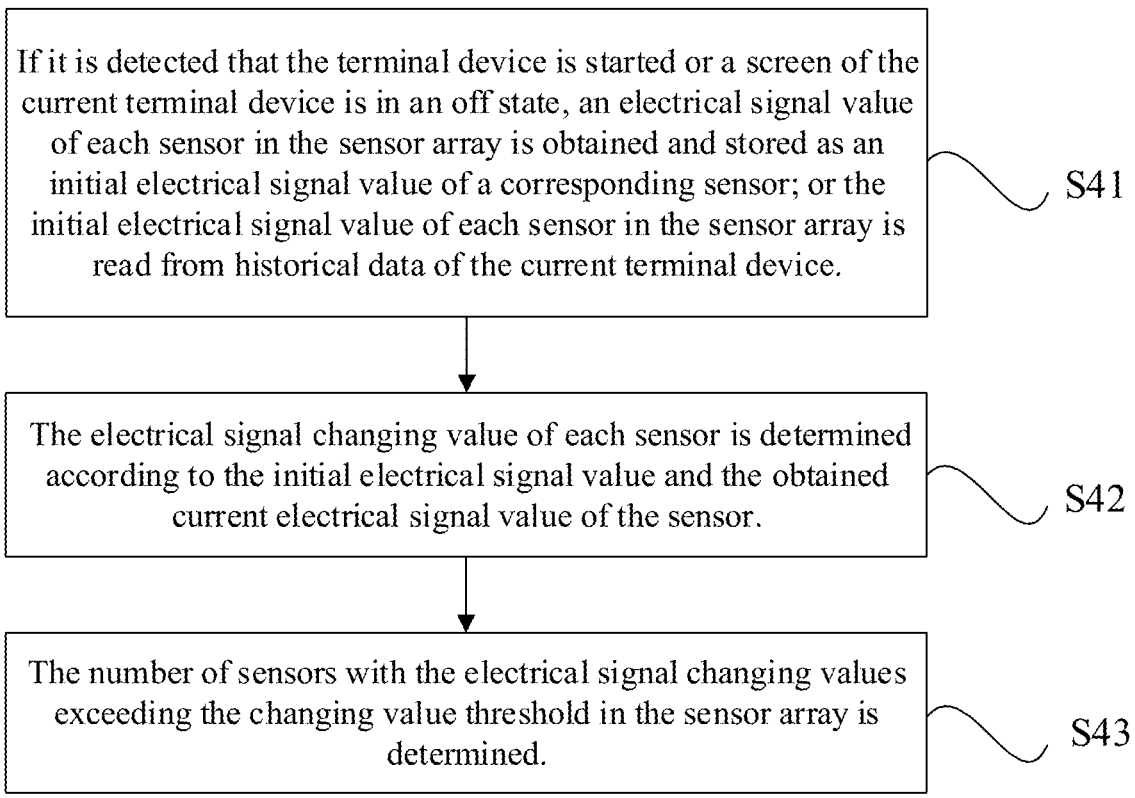
FIG. 4 is a flowchart illustrating determining the number of sensors with abnormally-changing electrical signals according to some other embodiments of the present disclosure.

FIG. 4 is a flowchart illustrating determining the number of sensors with abnormally-changing electrical signals according to another example of the present disclosure. As shown in FIG. 4, determining the number of sensors with abnormally-changing electrical signals at block S22 described above may include the following blocks S41 to S43.

Block S41: when it is detected that the terminal apparatus is started or a screen of the current terminal apparatus is in an off state, an electrical signal value of each sensor in the sensor array is obtained as an initial electrical signal value of a corresponding sensor; or the initial electrical signal value of each sensor in the sensor array is read from historical data of the current terminal apparatus.

In some embodiments, the electrical signal value of each sensor in the sensor array may be obtained as the initial electrical signal value of the corresponding sensor every time the terminal apparatus is detected to be started or the screen of the terminal apparatus is detected to be in the off state.

In another example, the electrical signal value of the sensor when the terminal apparatus is powered on may be stored as the initial electrical signal value in the historical data of the terminal apparatus, thereby subsequently reading the initial electrical signal value of each sensor from the historical data of the terminal apparatus.

It is to be noted that the accuracy of the initial electrical signal value of each sensor can be guaranteed by obtaining the electrical signal value of each sensor in the sensor array as the initial electrical signal value every time the terminal apparatus is detected to be started up or the screen of the terminal apparatus is detected to be in the off state. However, the complexity of implementing the solution may be increased accordingly. The solution of reading the initial electrical signal value from the historical data may reduce the complexity of implementing the solution. However, the accuracy of the initial electrical signal value may be reduced. Therefore, in a practical application, a manner of determining the initial electrical signal value may be selected according to an actual requirement, which is not limited herein.

Block S42: for each sensor in the sensor array, the electrical signal changing value of the sensor is determined according to the initial electrical signal value and the obtained current electrical signal value of the sensor.

Block S43: the number of sensors with the electrical signal changing values exceeding the changing value threshold in the sensor array is determined.

The relevant descriptions of blocks S42 and S43 may refer to an example shown in FIG. 3, which will not be described herein.

It can be known from the above description that the electrical signal value of each sensor in the sensor array may be obtained as the initial electrical signal value when the terminal apparatus is started or the screen of the terminal apparatus is in the off state; or, the initial electrical signal value of each sensor may be read from the historical data of the terminal apparatus.

Figure 5:
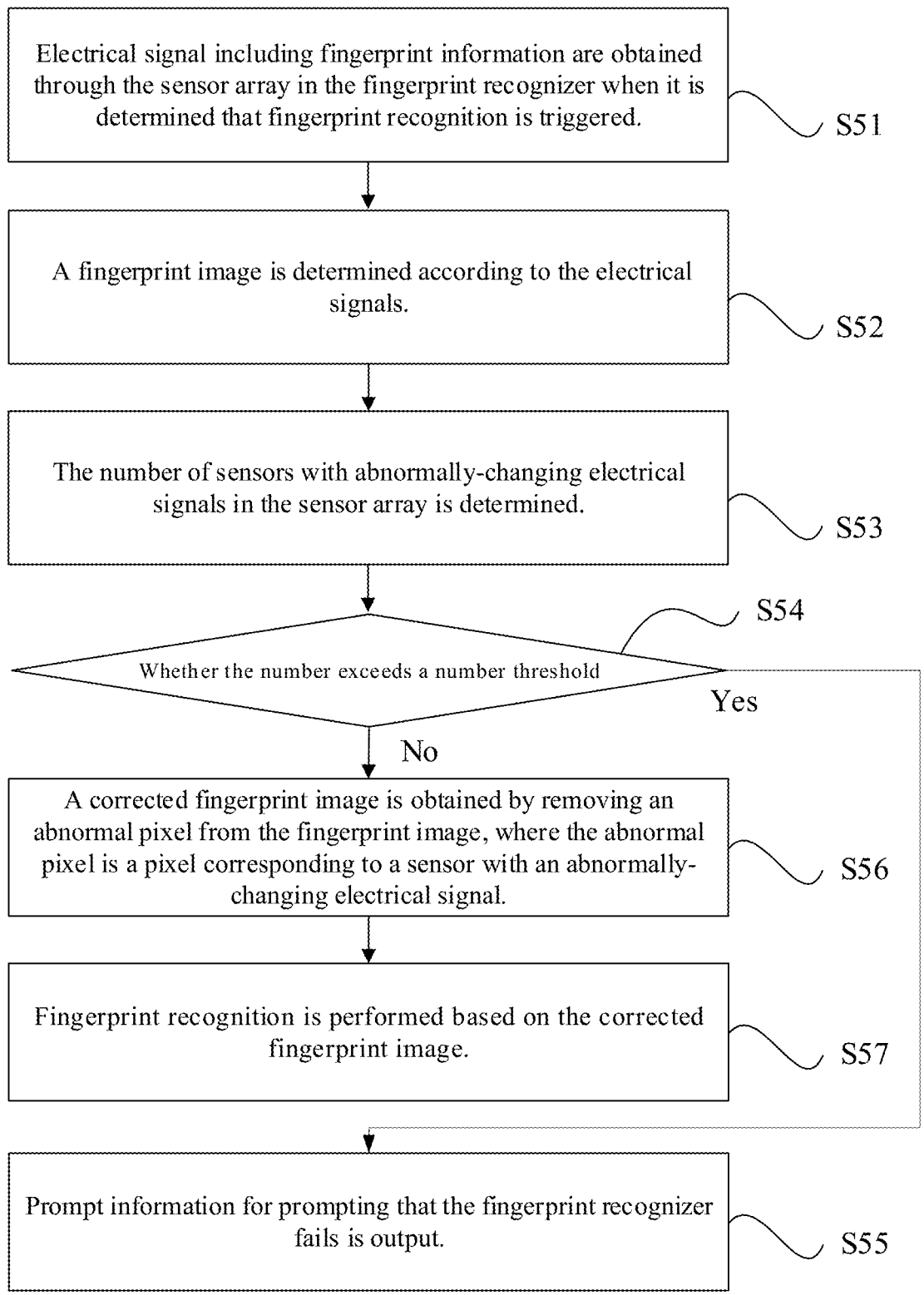
FIG. 5 is a flowchart illustrating a method of prompting a failure according to some other embodiments of the present disclosure.

FIG. 5 is a flowchart illustrating a method of prompting a failure according to another example of the present disclosure. As shown in FIG. 5, the method includes the following blocks S51 to S57.

Block S51: electrical signals including fingerprint information are obtained through the sensor array in the fingerprint recognizer when it is determined that fingerprint recognition is triggered.

Block S52: a fingerprint image is generated according to the electrical signals including fingerprint information.

In some embodiments, after the electrical signals including fingerprint information are obtained, the fingerprint image may be generated according to the electrical signals including fingerprint information.

It is to be noted that the fingerprint image of a user may also be generated after it is determined that the number of sensors with abnormally-changing electrical signals does not exceed the number threshold. When the fingerprint image is generated is not limited in this example.

Block S53: the number of sensors with abnormally-changing electrical signals in the sensor array is determined.

Block S54: whether the number exceeds the number threshold is determined. If yes, block S55 is performed; if no, block S56 is performed.

Block S55: prompt information for prompting that the fingerprint recognizer fails is output.

Block S56: a corrected fingerprint image is obtained by removing an abnormal pixel from the fingerprint image, where the abnormal pixel is a pixel corresponding to a sensor with an abnormally-changing electrical signal.

In some embodiments, when the fingerprint image is generated, the generated fingerprint image may be corrected, for example, by removing the abnormal pixel from the fingerprint image, where the abnormal pixel may be a pixel corresponding to the sensor with the abnormally-changing electrical signal.

Block S57: fingerprint recognition is performed based on the corrected fingerprint image.

In some embodiments, after the corrected fingerprint image is obtained, the fingerprint recognition may be performed based on the corrected fingerprint image.

In some embodiments, a manner of performing fingerprint recognition based on the corrected fingerprint image may refer to an example shown in FIG. 6 described below, which will not be described in detail herein.

The relevant descriptions of blocks S51, S53 and S55 may refer to the example shown in FIG. 2 described above, which will not be described herein.

It can be known from the above description that, In some embodiments, the quality of the fingerprint image can be improved by obtaining the corrected fingerprint image after removing the abnormal pixel from the fingerprint image and performing fingerprint recognition based on the corrected fingerprint image, thereby improving accuracy of the subsequent fingerprint recognitions.

Figure 6:
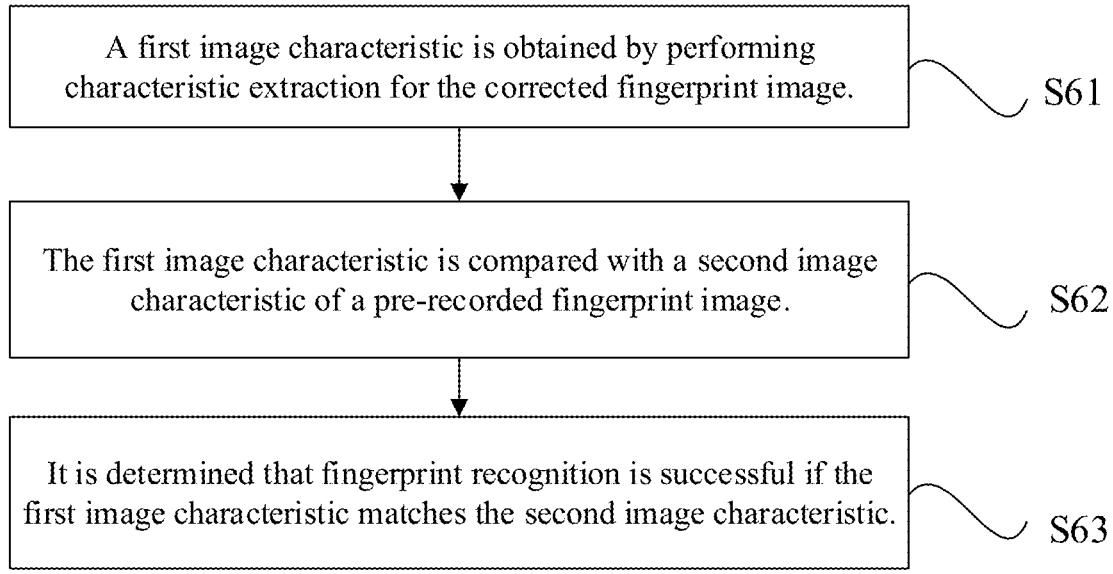
FIG. 6 is a flowchart illustrating performing fingerprint recognition based on a corrected fingerprint image according to some embodiments of the present disclosure.

FIG. 6 is a flowchart illustrating performing fingerprint recognition based on a corrected fingerprint image according to some embodiments of the present disclosure. As shown in FIG. 6, performing fingerprint recognition based on the corrected fingerprint image at block S57 described above may include the following blocks S61 to S63.

Block S61: a first image characteristic is obtained by performing characteristic extraction for the corrected fingerprint image.

In an alternative example, the first image characteristic may well highlight features of the fingerprint image.

In an alternative example, one first image characteristic may be extracted from the corrected fingerprint image, or a plurality of first image characteristics may be extracted at the same time so that the features of the fingerprint image can be fully and comprehensively displayed.

Block S62: the first image characteristic is compared with a second image characteristic of a pre-recorded fingerprint image.

In an alternative example, the second image characteristic may include a characteristic obtained by performing characteristic extraction for a fingerprint image pre-recorded and/or preset by a user.

In an alternative example, after the first image characteristic of the corrected fingerprint image and the second image characteristic of the pre-recorded fingerprint image are obtained, comparison, for example, similarity comparison, may be performed for the first image characteristic and the second image characteristic to obtain a similarity comparison result.

Block S63: it is determined that fingerprint recognition is successful if the first image characteristic matches the second image characteristic.

In an alternative example, after the similarity comparison result of the first image characteristic and the second image characteristic is obtained, the similarity comparison result (e.g. 80%) may be compared with a preset similarity threshold (e.g. 60%). If it is determined that the similarity comparison result exceeds the similarity threshold, it may be determined that the corrected fingerprint image matches the pre-recorded fingerprint image, thereby determining that the fingerprint recognition is successful.

It can be known from the above description that, In some embodiments, the accuracy of fingerprint recognition may be improved by obtaining the first image characteristic and comparing the first image characteristic with the second image characteristic of pre-recorded the fingerprint image.

Figure 7:
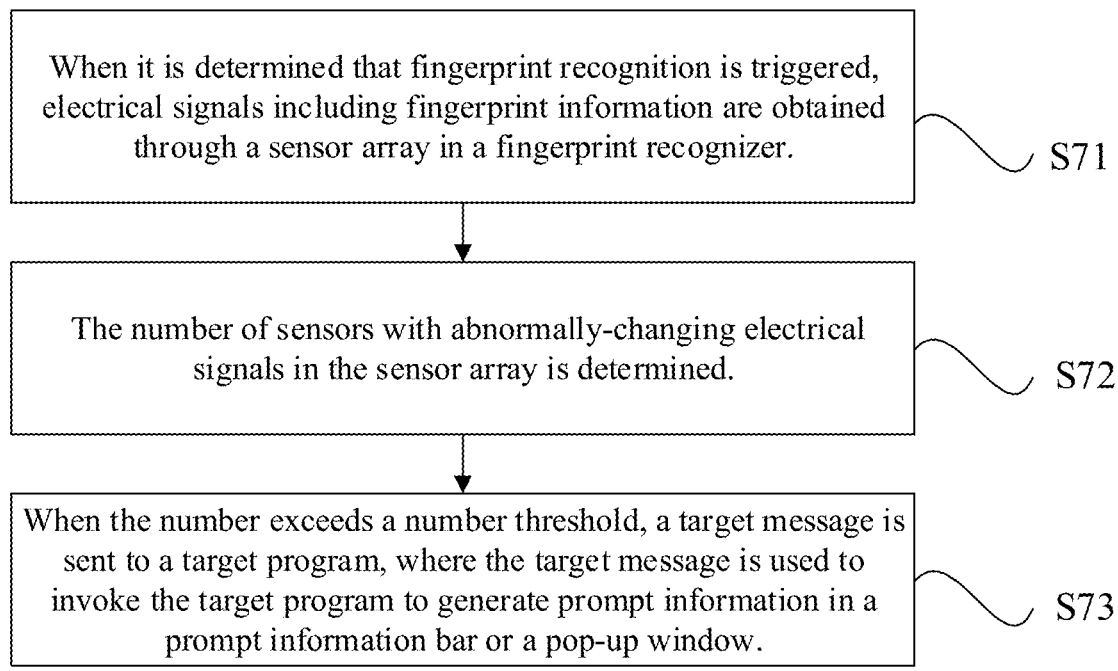
FIG. 7 is a flowchart illustrating a method of prompting a failure according to some other embodiments of the present disclosure.

FIG. 7 is a flowchart illustrating a method of prompting a failure according to still another example of the present disclosure. As shown in FIG. 7, the method includes the following blocks S71 to S73.

Block S71: when it is determined that fingerprint recognition is triggered, electrical signals including fingerprint information are obtained through a sensor array in a fingerprint recognizer.

Block S72: the number of sensors with abnormally-changing electrical signals in the sensor array is determined.

The relevant descriptions of blocks S71 and S72 may refer to the example shown in FIG. 2, which will not be described herein.

Block S73: when the number exceeds a number threshold, a target message is sent to a target program, where the target message is used to invoke the target program to generate prompt information in a prompt information bar or a pop-up window.

In some embodiments, the above target program may include a program having a function of invoking fingerprint recognition in a terminal apparatus, such as a terminal screen-locking program, and a third-party application requiring fingerprint recognition, which is not limited in this example.

In some embodiments, when the number of sensors with abnormally-changing electrical signals in the sensor array exceeds the number threshold, the target message may be sent to the target program, where the target message may invoke the target program to generate prompt information in a prompt information bar or a pop-up window, and the prompt information may be used to prompt that the fingerprint recognizer fails.

Figure 8:
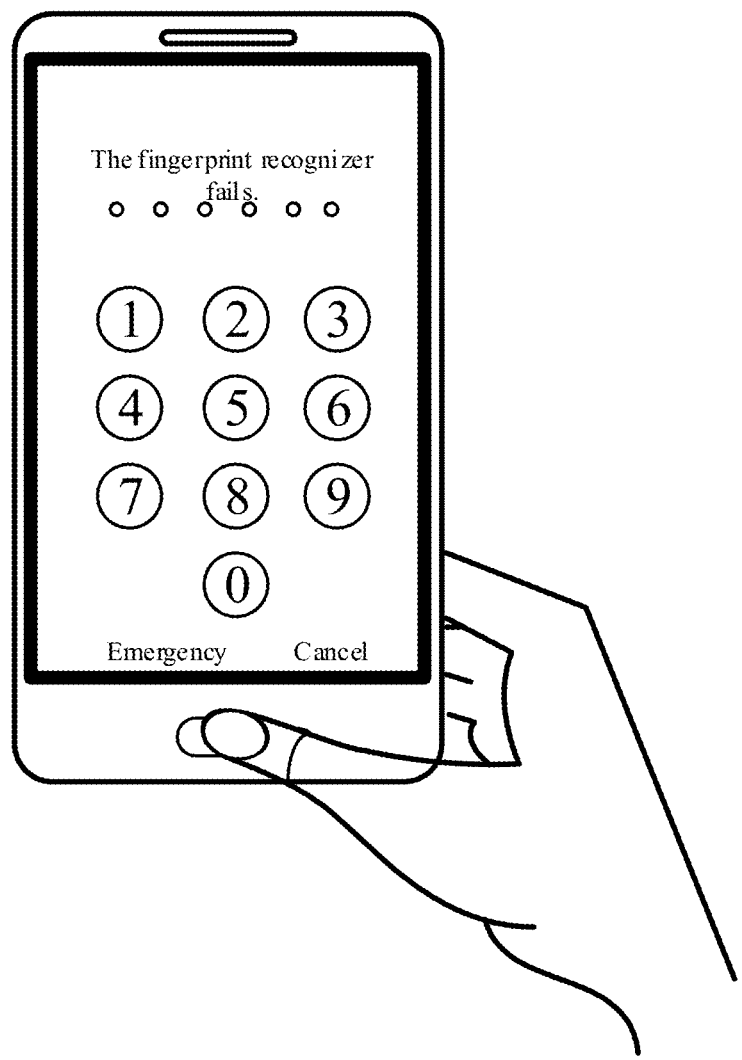
FIG. 8 is a schematic diagram illustrating an application scenario of a method of prompting a failure according to some embodiments of the present disclosure.

For example, FIG. 8 is a schematic diagram illustrating an application scenario of a method of prompting a failure according to some embodiments of the present disclosure. As shown in FIG. 8, when a user unlocks the terminal apparatus through a fingerprint recognition function, if it is determined that the fingerprint recognizer fails, an operation system of the terminal apparatus may send a target message (for example, the target message may be a code "Er," and may be transparent to the user of the terminal apparatus) to the target program (for example, a screen locking program of the terminal apparatus), thereby enabling the screen locking program to generate prompt information that "the fingerprint recognizer fails" in the prompt information bar.

It can be known from the above description that the user may be timely informed that the fingerprint recognizer fails by determining the number of sensors with abnormally-changing electrical signals in the sensor array of the fingerprint recognizer when electrical signals including fingerprint information are detected and sending the target message to the target program when it is determined that the number exceeds the number threshold, thereby eliminating a potential safety hazard of erroneously unlocking the terminal apparatus, where the target message is used to invoke the target program to generate prompt information in the prompt information bar or the pop-up window.

Figure 9:
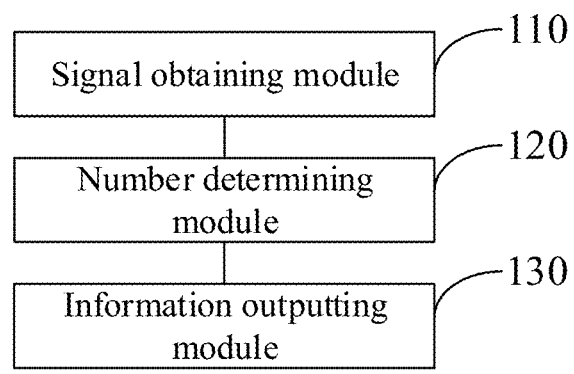
FIG. 9 is a block diagram illustrating a device for prompting a failure according to some embodiments of the present disclosure.

FIG. 9 is a block diagram illustrating a device for prompting a failure according to some embodiments of the present disclosure. The example may be applicable to different terminal apparatuses (such as a mobile phone, a tablet computer and a personal computer) including a fingerprint recognizer. As shown in FIG. 9, the apparatus includes a signal obtaining module 110, a number determining module 120 and an information outputting module 130.

The various device components, units, blocks, or portions may have modular configurations, or are composed of discrete components, but nonetheless may be referred to as "modules" in general. In other words, the "modules" or "units" referred to herein may or may not be in modular forms.

The various device components, units, blocks, portions, or modules may be realized with hardware, software, or a combination of hardware and software.

The signal obtaining module 110 is configured to obtain electrical signals including fingerprint information through a sensor array in the fingerprint recognizer when it is determined that fingerprint recognition is triggered.

The number determining module 120 is configured to determine a number of sensors with abnormally-changing electrical signals in the sensor array.

The information outputting module 130 is configured to output prompt information for prompting that the fingerprint recognizer fails when the number of sensors with abnormally-changing electrical signals in the sensor array exceeds a number threshold.

Figure 10:
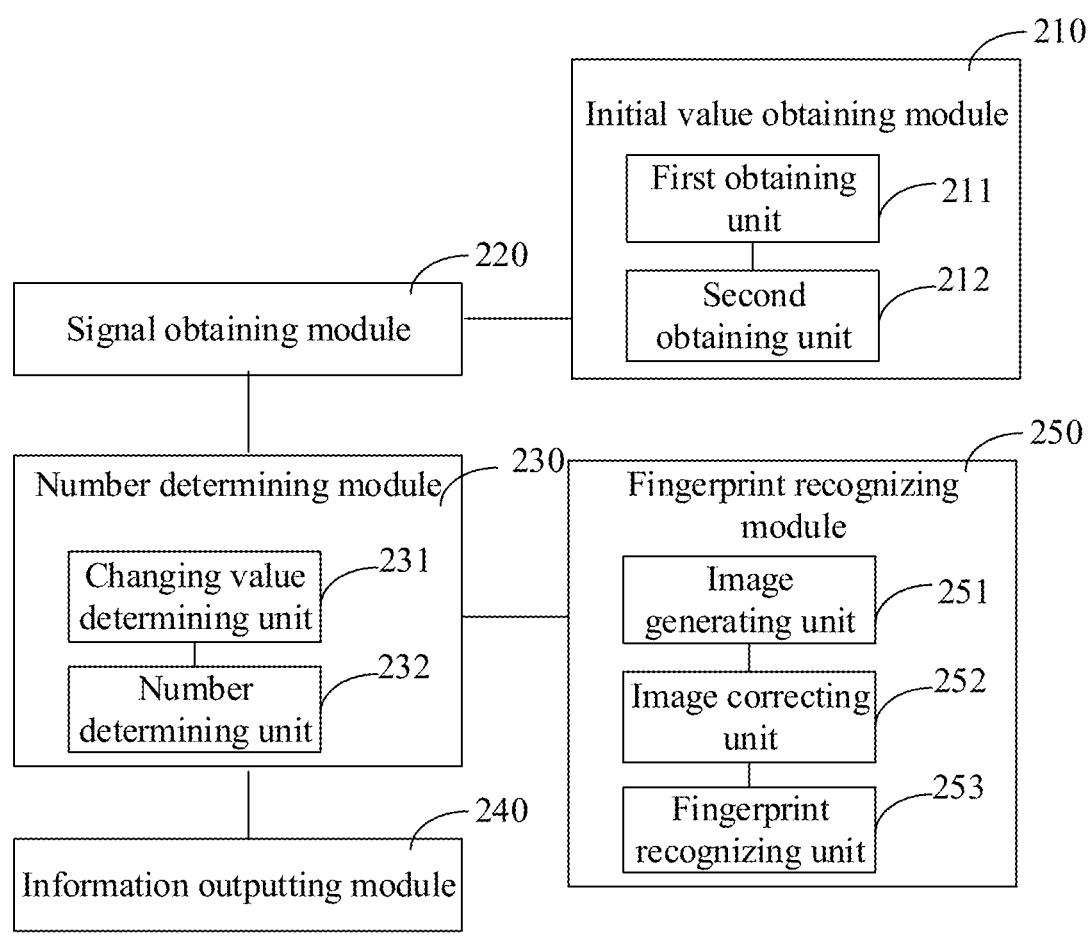
FIG. 10 is a block diagram illustrating a device for prompting a failure according to some embodiments of the present disclosure.

FIG. 10 is a block diagram illustrating a device for prompting a failure according to another example of the present disclosure. A signal obtaining module 220, a number determining module 230 and an information outputting module 240 have same functions as the signal obtaining module 110, the number determining module 120 and the information outputting module 130 in the example as shown in FIG. 9 described above, which will not be described herein.

In some embodiments, the abnormal change of the electrical signal includes that an electrical signal changing value exceeds a changing value threshold.

The number determining module 230 may include: a changing value determining unit 231, configured to determine a difference between an initial electrical signal value and an obtained current electrical signal value of each sensor of the sensor array as an electrical signal changing value of the sensor; and a number determining unit 232, configured to determine the number of sensors with the electrical signal changing values exceeding the changing value threshold in the sensor array.

In some embodiments, the device may also include an initial value obtaining module 210 including a first obtaining unit 211, configured to obtain an electrical signal value of each sensor in the sensor array as an initial electrical signal value of the corresponding sensor when it is detected that a terminal apparatus is started or a screen of the current terminal apparatus is in an off state.

The initial value obtaining module 210 may also include a second obtaining unit 212, configured to read the initial electrical signal value of each sensor in the sensor array from historical data of the terminal apparatus.

In some embodiments, the device may also include a fingerprint recognizing module 250, including: an image generating unit 251, configured to generate a fingerprint image according to electrical signals including fingerprint information; an image correcting unit 252, configured to obtain a corrected fingerprint image by removing an abnormal pixel from the fingerprint image when the number of sensors with abnormally-changing electrical signals in the sensor array does not exceed the number threshold, where the abnormal pixel is a pixel corresponding to a sensor with an abnormally-changing electrical signal; and a fingerprint recognizing unit 253, configured to perform fingerprint recognition based on the corrected fingerprint image.

In some embodiments, the fingerprint recognizing unit 253 may also be configured to: obtain a first image characteristic by performing characteristic extraction for the corrected fingerprint image; compare the first image characteristic with a second image characteristic of a pre-recorded fingerprint image; and determine that the fingerprint recognition is successful if the first image characteristic matches the second image characteristic.

In some embodiments, the information outputting module 240 may also be configured to send a target message to a target program when the number of sensors with abnormally-changing electrical signals in the sensor array exceeds the number threshold, where the target message is used to invoke the target program to generate prompt information in a prompt information bar or a pop-up window.

A specific manner of performing operation by each module of the apparatus in the above example is described in detail in the relevant method examples, which will not be described in detail herein.

Figure 11:
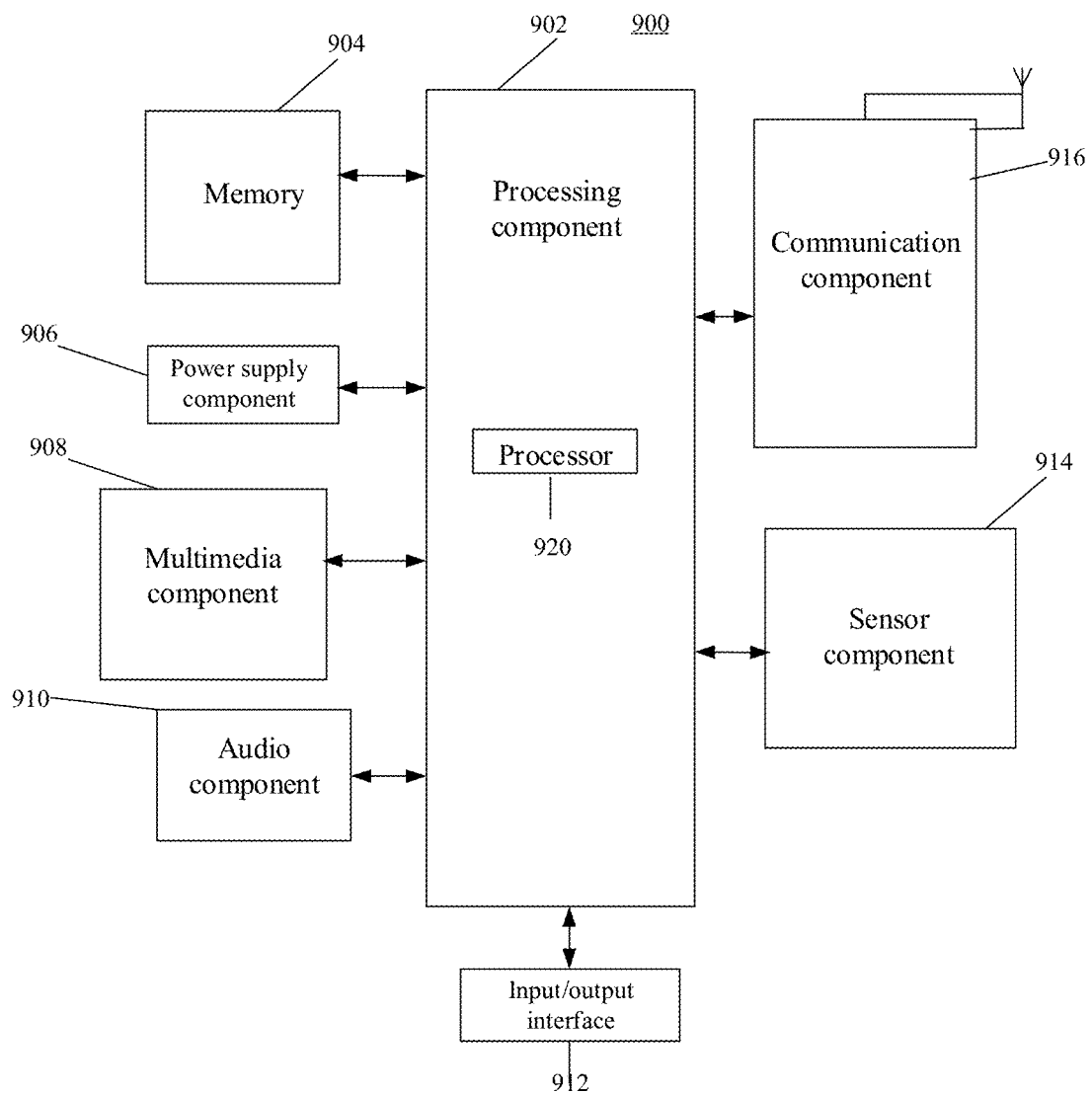
FIG. 11 is a block diagram illustrating an electronic device according to some embodiments of the present disclosure.

FIG. 11 is a block diagram illustrating an electronic apparatus according to some embodiments of the present disclosure. For example, the apparatus 900 may be a mobile phone, a computer, a digital broadcast terminal, a message transceiving device, a game console, a tablet device, a medical device, a fitness device, a personal digital assistant and the like.

As shown in FIG. 11, the apparatus 900 may include one or more of the following components: a processing component 902, memory 904, a power supply component 906, a multimedia component 908, an audio component 910, an input/output (I/O) interface 912, a sensor component 914 and a communication component 916.

The processing component 902 usually controls overall operations of the apparatus 900, such as operations related to display, a telephone call, data communication, a camera operation and a record operation. The processing component 902 may include one or more processors or processing circuits 920 for executing instructions to complete all or a part of blocks of the above method. Further, the processing component 902 may include one or more modules to facilitate interaction between the processing component 902 and another component. For example, the processing component 902 may include a multimedia module to facilitate the interaction between the multimedia component 908 and the processing component 902.

The memory 904 is configured to store different types of data to support operations at the apparatus 900. Examples of such data include instructions, contact data, phonebook data, messages, pictures, videos, and so on for any application or method that operates on the apparatus 900. The memory 904 may be implemented by any type of volatile or non-volatile memory devices or a combination thereof, such as a Static Random-Access Memory (SRAM), an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, a magnetic disk or an optical disk.

The power supply component 906 supplies power for different components of the apparatus 900. The power supply component 906 may include a power supply management system, one or more power supplies, and other components associated with generating, managing and distributing power for the apparatus 900.

The multimedia component 908 includes a screen for providing an output interface between the apparatus 900 and a user. In some examples, the screen may include a Liquid Crystal Display (LCD) and a Touch Panel (TP). If the screen includes a touch panel, the screen may be implemented as a touch screen for receiving an input signal from a user. The touch panel may include one or more touch sensors for sensing a touch, a slide and a gesture on the touch panel. The touch sensor may not only sense a boundary of a touching or sliding movement, but also detect duration and pressure related to the touching or sliding operation.

In some implementations, the display device is not limited to the LCD display, but can include, for example, a VR/AR device, a head-mount display (HMD) device, a head-up display (HUD) device, smart eyewear (e.g., glasses), OLED (organic light emitting diode), TFT (thin-film transistor), plasma, other flexible configuration, or any other monitor for displaying information to the user and a keyboard, a pointing device, e.g., a mouse, trackball, etc., or a touch screen, touch pad, etc., by which the user can provide input to the computer.

In some examples, the multimedia component 908 may include a front camera and/or a rear camera. When the apparatus 900 is in an operation mode, such as a shooting mode or a video mode, the front camera and/or the rear camera may receive external multimedia data. Each of the front camera and the rear camera may be a fixed optical lens system or be capable of a focal length and an optical zoom capability.

The audio component 910 is configured to output and/or input an audio signal. For example, the audio component 910 includes a microphone (MIC). When the apparatus 900 is in an operation mode, such as a call mode, a record mode and a voice recognition mode, the microphone is configured to receive an external audio signal. The received audio signal may be further stored in the memory 904 or sent via the communication component 916. In some examples, the audio component 910 also includes a speaker for outputting an audio signal.

The I/O interface 912 provides an interface between the processing component 902 and a peripheral interface module. The above peripheral interface module may be a keyboard, a click wheel, a button, or the like. These buttons may include but not limited to, a home button, a volume button, a start button and a lock button.

The sensor component 914 includes one or more sensors for providing a state assessment in different aspects for the apparatus 900. For example, the sensor component 914 may detect an on/off state of the apparatus 900 and a relative location of components. For example, the components are a display and a keypad of the apparatus 900. The sensor component 914 may also detect a position change of the apparatus 900 or a component of the apparatus 900, presence or absence of a touch of a user on the apparatus 900, an orientation or acceleration/deceleration of the apparatus 900, and a temperature change of apparatus 900. The sensor component 914 may include a proximity sensor for detecting the existence of a nearby object without any physical touch. The sensor component 914 may also include an optical sensor, such as a CMOS or CCD image sensor used in an imaging application. In some examples, the sensor component 914 may also include an acceleration sensor, a gyro sensor, a magnetic sensor, a pressure sensor, or a temperature sensor.

The communication component 916 is configured to facilitate wired or wireless communication between the apparatus 900 and other devices. The apparatus 900 may access a wireless network based on a communication standard, such as WiFi, 2G or 3G, or a combination thereof. In some embodiments, the communication component 916 receives a broadcast signal or broadcast related information from an external broadcast management system via a broadcast channel. In some embodiments, the communication component 916 may also include a Near Field Communication (NFC) module for promoting short-range communication. For example, the NFC module may be implemented based on radio frequency identification (RFID) technology, infrared data association (IrDA) technology, ultra-wideband (UWB) technology, Bluetooth (BT) technology and other technology.

In some embodiments, the apparatus 900 may be implemented by one or more application specific integrated circuits (ASIC), digital signal processors (DSP), digital signal processing devices (DSPD), programmable logic devices (PLD), field programmable gate arrays (FPGA), controllers, microcontrollers, microprocessors or other electronic elements, for executing the above method of prompting a failure.

In some embodiments, a non-transitory computer readable storage medium including instructions such as the memory 904 including instructions is also provided. The above instructions may be executed by the processor 920 of the apparatus 900 to perform the above method of prompting a failure. For example, the non-transitory computer readable storage medium may be a Read-Only Memory (ROM), a Random-Access Memory (RAM), a CD-ROM, a magnetic tape, a floppy disk and an optical data storage device, etc.

In the description of the present disclosure, the terms "one embodiment," "one implementation," "some embodiments," "some implementations," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Therefore, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method of prompting a failure or error applicable to a terminal apparatus comprising a fingerprint recognizer having a sensor array, the method comprising:
    obtaining electrical signals containing fingerprint information through the sensor array upon a fingerprint recognition being triggered;
    generating a fingerprint image according to the electrical signals containing the fingerprint information;
    determining a number of sensors with abnormally-changing electrical signals in the sensor array; by:
        determining, for each sensor in the sensor array, an electrical signal changing value by taking a difference between a current electrical signal value and an initial electrical signal value of the sensor; and
        determining the number of sensors with electrical signal changing values exceeding a changing value threshold in the sensor array as the number of the sensors with abnormally-changing electrical signals;
    outputting prompt information upon the determined number of sensors with abnormally-changing electrical signals in the sensor array exceeding a number threshold;
    obtaining a corrected fingerprint image by removing abnormal pixels from the fingerprint image when it is determined that the number of sensors with abnormally-changing electrical signals in the sensor array does not exceed the number threshold, wherein the abnormal pixels are pixels corresponding to the number of sensors with abnormally-changing electrical signals in the sensor array; and
    performing the fingerprint recognition based on the corrected fingerprint image.

2. The method of claim 1, further comprising at least one of:
  obtaining an electrical signal value of each sensor in the sensor array when the terminal apparatus is started as the initial electrical signal value;
  obtaining the electrical signal value of each sensor in the sensor array when a screen of the terminal apparatus is in an off state as the initial electrical signal value; or
  reading the initial electrical signal value of each sensor in the sensor array from historical data of the terminal apparatus.

3. The method of claim 1, wherein the performing the fingerprint recognition based on the corrected fingerprint image comprises:
  obtaining a first image characteristic by performing characteristic extraction from the corrected fingerprint image;
  comparing the first image characteristic with a second image characteristic of a pre-recorded fingerprint image; and
  determining that the fingerprint recognition is successful upon the first image characteristic matching the second image characteristic.

4. The method of claim 1, wherein the outputting the prompt information comprises:
  sending a target message to a target program, wherein the target message is configured to invoke the target program to generate the prompt information in a prompt information bar or a pop-up window.

5. A device configured to prompt a failure or error in a terminal apparatus comprising a fingerprint recognizes having a sensor array, the device comprising:
  a processor; and
  memory storing instructions executable by the processor;
  wherein the instructions cause the processor to:
    obtain electrical signals containing fingerprint information through the sensor array upon a finger recognition being triggered;
    generate a fingerprint image according to the electrical signals containing the fingerprint information;
    determine a number of sensors with abnormally-changing electrical signals in the sensor array; by:
      determine, for each sensor in the sensor array, an electrical signal changing value by taking a difference between a current electrical signal value and an initial electrical signal value of the sensor; and
      determine the number of sensors with electrical signal changing values exceeding a changing value threshold in the sensor array as the number of the sensors with abnormally-changing electrical signals;
    output prompt information upon the number of sensors with abnormally-changing electrical signals in the sensor array exceeding a number threshold;
    obtain a corrected fingerprint image by removing abnormal pixels from the fingerprint image when it is determined that the number of sensors with abnormally-changing electrical signals in the sensor array does not exceed the number threshold, wherein the abnormal pixels are pixels corresponding to the number of sensors with abnormally-changing electrical signals in the sensor array; and
    perform the fingerprint recognition based on the corrected fingerprint image.

6. The device of claim 5, wherein the instructions further cause the processor to implement at least one of:
  obtaining an electrical signal value of each sensor in the sensor array when the terminal apparatus is started as the initial electrical signal value;
  obtaining the electrical signal value of each sensor in the sensor array when a screen of the terminal apparatus is in an off state as the initial electrical signal value; or
  reading the initial electrical signal value of each sensor in the sensor array from historical data of the terminal apparatus.

7. The device of claim 5, wherein when the fingerprint recognition is performed based on the corrected fingerprint image, the instructions cause the processor to:
  obtain a first image characteristic by performing characteristic extraction from the corrected fingerprint image;
  compare the first image characteristic with a second image characteristic of a pre-recorded fingerprint image; and
  determine that the fingerprint recognition is successful upon the first image characteristic matching the second image characteristic.

8. The device of claim 5, wherein when outputting the prompt information, the instructions cause the processor to:
  send a target message to a target program, wherein the target message is configured to invoke the target program to generate the prompt information in a prompt information bar or a pop-up window.

9. A non-transitory computer-readable storage medium storing instructions for execution by a processing circuit, the instructions comprising:
  obtaining electrical signals containing fingerprint information through a sensor array in a fingerprint recognizer upon a finger recognition being triggered;
  generating a fingerprint image according to the electrical signals containing the fingerprint information;
  determining a number of sensors with abnormally-changing electrical signals in the sensor array; by:
    determining, for each sensor in the sensor array, an electrical signal changing value by taking a difference between a current electrical signal value and an initial electrical signal value of the sensor; and
    determining the number of sensors with electrical signal changing values exceeding a changing value threshold in the sensor array as the number of the sensors with abnormally-changing electrical signals;
  outputting prompt information upon the number of sensors with abnormally-changing electrical signals in the sensor array exceeding a number threshold;
  obtaining a corrected fingerprint image by removing abnormal pixels from the fingerprint image when it is determined that the number of sensors with abnormally-changing electrical signals in the sensor array does not exceed the number threshold, wherein the abnormal pixels are pixels corresponding to the number of sensors with abnormally-changing electrical signals in the sensor array; and
  performing the fingerprint recognition based on the corrected fingerprint image.

10. The non-transitory computer-readable storage medium of claim 9, wherein the processing circuit is caused by executing the program to implement one or more of the following:
  obtaining an electrical signal value of each sensor in the sensor array when the terminal apparatus is started as the initial electrical signal value;
  obtaining the electrical signal value of each sensor in the sensor array when a screen of the terminal apparatus is in an off state as the initial electrical signal value; or reading the initial electrical signal value of each sensor in the sensor array from historical data of the terminal apparatus.

11. The non-transitory computer-readable storage medium of claim 9, wherein when fingerprint recognition is performed based on the corrected fingerprint image, the processor is caused by executing the program to:
- obtain a first image characteristic by performing characteristic extraction from the corrected fingerprint image;
- compare the first image characteristic with a second image characteristic of a pre-recorded fingerprint image; and
- determine that the fingerprint recognition is successful upon the first image characteristic matching the second image characteristic.

12. The non-transitory computer-readable storage medium of claim 9, wherein when outputting the prompt information, the processor is caused by executing the program to:
- send a target message to a target program, wherein the target message is configured to invoke the target program to generate the prompt information in a prompt information bar or a pop-up window.

\* \* \* \* \*